(12) United States Patent
Park et al.

(10) Patent No.: US 7,994,551 B2
(45) Date of Patent: Aug. 9, 2011

(54) IMAGE SENSOR AND METHOD OF FABRICATING THE SAME

(75) Inventors: Won-je Park, Yongin-si (KR); Duk-min Yi, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 989 days.

(21) Appl. No.: 11/896,951

(22) Filed: Sep. 7, 2007

(65) Prior Publication Data

US 2008/0087733 A1    Apr. 17, 2008

(30) Foreign Application Priority Data

Sep. 7, 2006  (KR) .................. 10-2006-0086166

(51) Int. Cl.
*H01L 27/146* (2006.01)
(52) U.S. Cl. ........ 257/292; 257/290; 257/291; 257/446; 257/462; 257/E27.133; 257/E27.131; 257/E31.085; 257/E21.617; 438/73; 438/75
(58) Field of Classification Search .......... 257/290–292, 257/466, 257, 258, 446, 462, E27.131–E27.133, 257/E31.085, E21.617; 438/73, 75
See application file for complete search history.

(56) References Cited

U.S. PATENT DOCUMENTS

| 6,462,365 | B1 * | 10/2002 | He et al. | 257/292 |
| 7,321,141 | B2 * | 1/2008 | Sze | 257/233 |
| 2008/0035969 | A1 * | 2/2008 | Ko et al. | 257/292 |

FOREIGN PATENT DOCUMENTS

| JP | 01-135184 | 5/1989 |
| KR | 100261158 | 4/2000 |
| KR | 1020020058876 | 7/2002 |
| KR | 100370148 | 1/2003 |
| KR | 1020040003961 | 1/2004 |
| KR | 1020040093971 | 11/2004 |

* cited by examiner

*Primary Examiner* — Jerome Jackson, Jr.
*Assistant Examiner* — Yu Chen
(74) *Attorney, Agent, or Firm* — Harness, Dickey & Pierce, PLC

(57) ABSTRACT

An image sensor according to an example embodiment may include a plurality of photoelectric transformation active regions, a plurality of read active regions, and/or at least one read gate. The plurality of photoelectric transformation active regions may be formed on a substrate. Each read active region may be formed adjacent to one of the plurality of photoelectric transformation active regions. Each read gate may be formed on one of the read active regions and partially overlap at least one of the adjacent photoelectric transformation active regions. Each read gate may be electrically isolated from the overlapping portion of the photoelectric transformation active region.

23 Claims, 9 Drawing Sheets

IMAGE SENSOR AND METHOD OF FABRICATING THE SAME

PRIORITY STATEMENT

This application claims priority under 35 U.S.C. §119 to Korean Patent Application No. 2006-0086166, filed on Sep. 7, 2006, in the Korean Intellectual Property Office, the entire contents of which are incorporated herein by reference.

BACKGROUND

1. Field

Example embodiments are directed to image sensors, for example, to image sensors that may improve signal saturation and sensitivity by improving a fill factor, and methods of fabricating the image sensors.

2. Description of Related Art

An image sensor may convert an optical image into an electrical signal. A Metal-Oxide Semiconductor (MOS) image sensor may be implemented using various scanning methods. Because a MOS image sensor may be integrated into a single chip, the miniaturization of products incorporating image sensors may be facilitated. Because existing MOS manufacturing technology may be used to manufacture MOS image sensors, manufacturing costs associated with the image sensors may be decreased. Further, because power consumption by the image sensors may be relatively low, MOS image sensors may be more readily applied to products having a limited battery capacity.

However, as the integration of pixels increases in order to satisfy increased resolution, the size of each pixel may decrease, thereby decreasing the fill factor as well. The term "fill factor," as used herein, may refer to the ratio of the area of a photoelectric transformation element to the area of a unit pixel.

Because a photoelectric transformation element and read gates, for example, a select element, a drive element and a reset element, may need to be spaced apart from each other, there is a limitation in the increase in the volume of a photoelectric transformation element due to this design trade-off for the read gates and the photoelectric transformation element.

Since the volume of a photoelectric transformation element per unit pixel may be decreased, signal saturation and sensitivity may deteriorate.

SUMMARY

An image sensor according to an example embodiment may include a plurality of photoelectric transformation active regions, a plurality of read active regions, and/or at least one read gate. The plurality of photoelectric transformation active regions may be formed on a substrate. Each read active region may be formed adjacent to one of the plurality of photoelectric transformation active regions. Each read gate may be formed on one of the read active regions and partially overlap at least one of the adjacent photoelectric transformation active regions. Each read gate may be electrically isolated from the overlapping portion of the photoelectric transformation active region.

The image sensor may also include a plurality of first and second unit pixel active areas defined by device isolation regions in the substrate. Each unit pixel active area may include one of the plurality of read active regions and one of the plurality of photoelectric transformation active regions. In addition, each read gate may include at least one of a reset element, a drive element and a select element.

The image sensor may also include a plurality of insulating layer patterns, each configured to electrically isolate one of the plurality of read gates from one of the photoelectric transformation active regions. Each photoelectric transformation active region may have a substantially rectangular shape, at least one side of which may overlap the read gate. Each insulating layer pattern may be formed to extend along the one overlapping side.

Each insulating layer pattern may be made of a nitride layer, an oxide layer, an oxynitride layer, or a composite layer thereof. Each insulating layer pattern may have a thickness sufficient to electrically isolate each read gate from each adjacent photoelectric transformation active region.

An image sensor according to another example embodiment may include a photoelectric transformation element, a channel region, a read gate, and/or an insulating pattern. The photoelectric transformation element and the channel region may be separated by a device isolation region. The read gate may be formed on the channel region and partially overlap the photoelectric transformation element. The insulating layer pattern may be configured to electrically isolate the read gate from the photoelectric transformation element.

The read gate may include at least one of a reset element, a drive element and a select element. The insulating layer pattern may be formed to cover at least a portion of the device isolation region and at least a portion of the photoelectric transformation element. The insulating layer pattern may be made of a nitride layer, an oxide layer, an oxynitride layer, or a composite layer thereof. The insulating layer pattern may have a thickness sufficient to electrically isolate the read gate from the photoelectric transformation element.

A method of fabricating an image sensor according to an example embodiment may include forming a plurality of photoelectric transformation active regions, a plurality of read active regions, and/or at least one read gate. The plurality of photoelectric transformation active regions may be formed on a substrate. The plurality of read active regions may also be formed on the substrate. Each read active region may be formed adjacent to one of the plurality of photoelectric transformation active regions. The read gates may be formed on each read active region to partially overlap at least one of the adjacent photoelectric transformation active regions. Each read gate may be electrically isolated from the overlapping portion of the adjacent photoelectric transformation active region.

The method may also include forming first and second unit pixel active areas by using device isolation regions to divide the plurality of photoelectric transformation active regions and the plurality of read active regions. Each unit pixel active area may include one of the plurality of photoelectric transformation active regions and one of the plurality of read active regions.

Each read gate may include at least one of a reset element, a drive element and a select element.

The method may also include forming a plurality of insulating layer patterns to electrically isolate the plurality of photoelectric transformation active regions from the plurality of read gates. Each photoelectric transformation active region may be formed in a substantially rectangular shape, at least one side of which may overlap one of the plurality of read gates. Each insulating layer pattern may be formed to extend along the at least one overlapping side.

Each insulating layer pattern may be made of a nitride layer, an oxide layer, an oxynitride layer, or a composite layer thereof. Each insulating layer pattern may have a thickness sufficient to electrically isolate the read gate from the photoelectric transformation element.

A method of fabricating an image sensor according to another example embodiment may include forming a photoelectric transformation element, a channel region, a device isolation region, and/or a read gate. The photoelectric transformation element may be formed on a substrate. The channel region may also be formed on the substrate. The device isolation region may be formed to separate the photoelectric transformation region from the channel region. The read gate may be formed on the channel region and partially overlap the photoelectric transformation element.

The read gate may include at least one of a reset element, a drive element and a select element. The method may also include forming an insulating layer pattern to cover at least a portion of the device isolation region and at least a portion of the photoelectric transformation element. The insulating layer pattern may be made of a nitride layer, an oxide layer, an oxynitride layer, or a composite layer thereof. The insulating layer pattern may be configured to electrically isolate the read gate from the photoelectric transformation element.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DESCRIPTION OF EXAMPLE EMBODIMENTS

Figure 1:
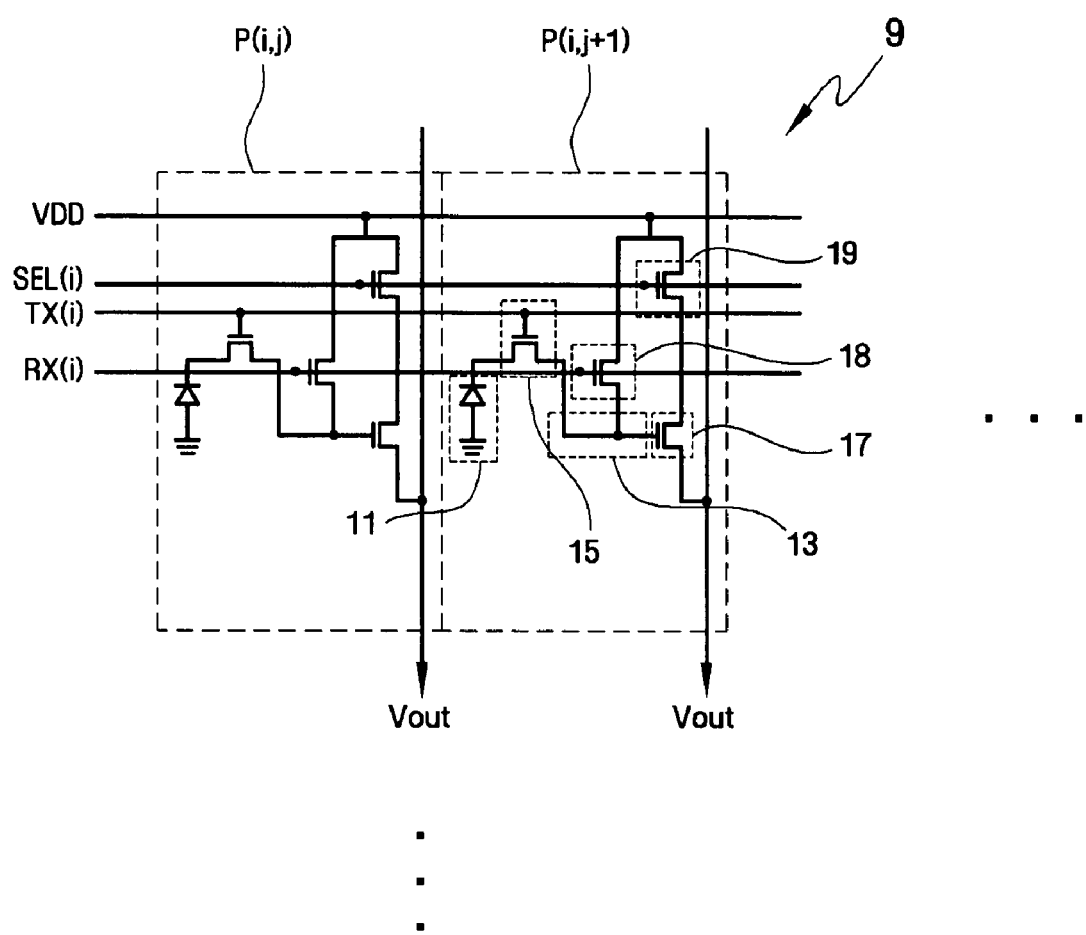
FIG. 1 is an example circuit diagram showing the active pixel sensor array of a non-shared pixel image sensor according to an example embodiment.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Example embodiments are directed to an image sensor having an insulating layer pattern for improving the signal saturation and sensitivity of a photoelectric transformation element. A unit pixel active area may include a floating diffusion region (hereinafter referred to as an "FD") for reading charges accumulated in a photoelectric transformation element, and/or a read active region, in which a plurality of read gates may be formed. The read gates may include a select element, a drive element and/or a reset element.

Figure 2A:
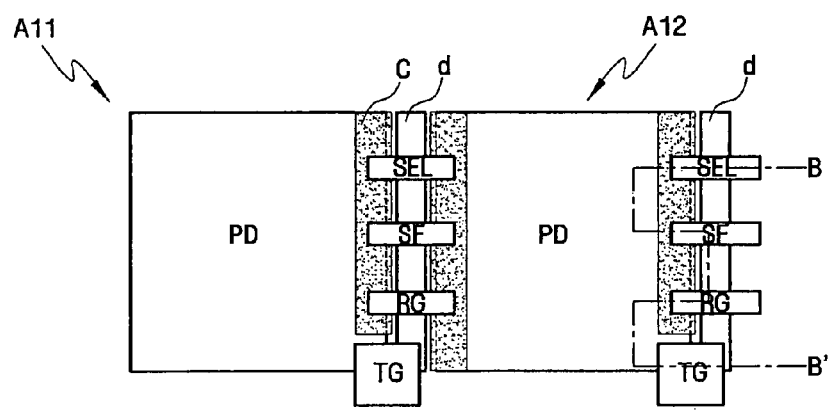
FIG. 2A is a diagram showing the layout of the non-shared pixel image sensor of FIG. 1.
Figure 2B:
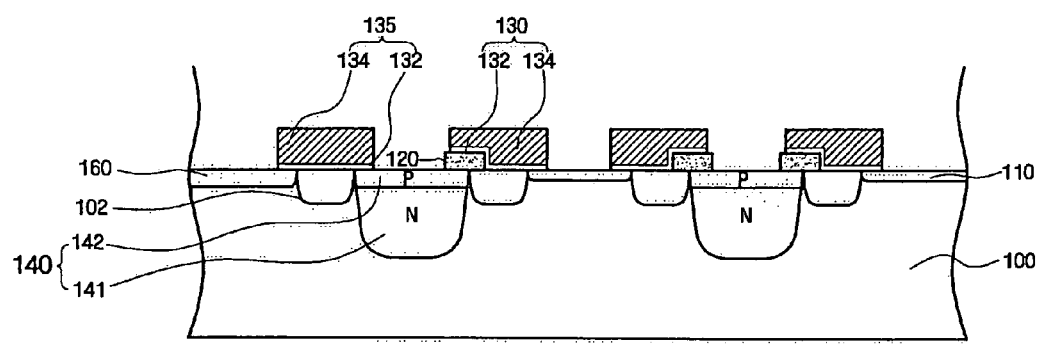
FIG. 2B is a sectional view of the image sensor taken along line B-B' of FIG. 2A.
Figure 2B:
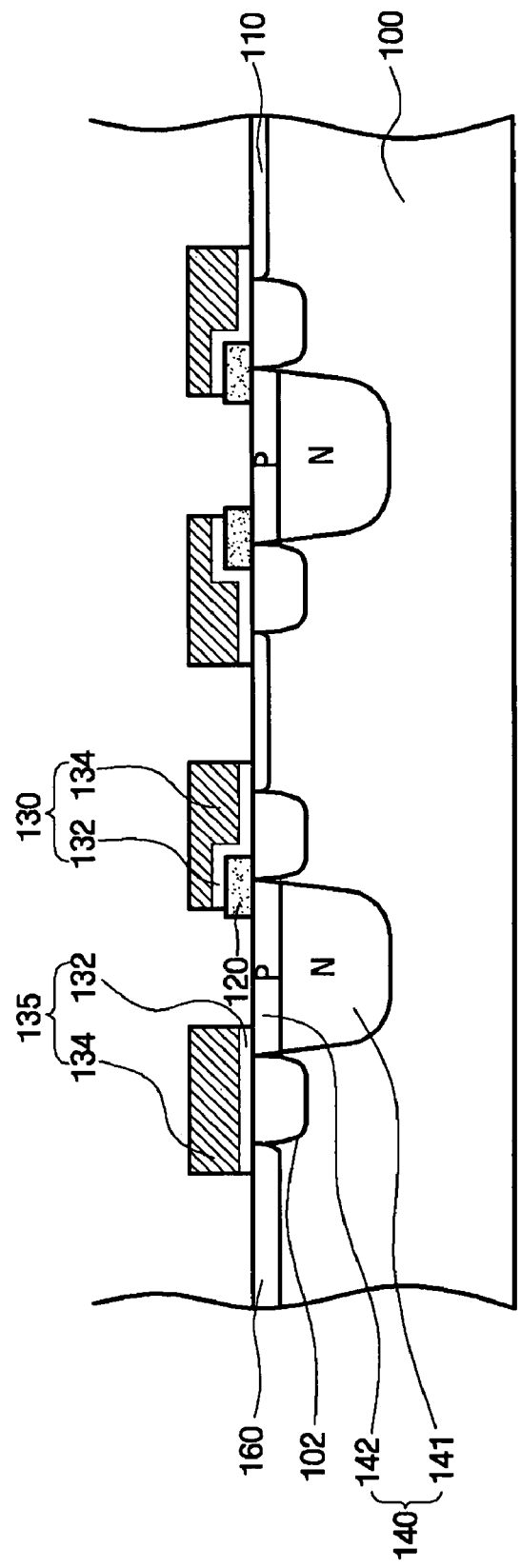

FIGS. 1, 2A, and 2B show an image sensor according to an example embodiment, in which an Active Pixel Sensor (APS) array may be implemented using non-shared pixels, illustrated as first and second unit pixel active areas.

FIG. 1 is a circuit diagram of the active pixel sensor array of a non-shared pixel image sensor according to an example embodiment.

Referring to FIG. 1, non-shared pixels P may be arranged in a matrix form, thereby forming an APS array 9. Each of the non-shared pixels P may be provided with a drive element 17, a reset element 18, and/or a select element 19 for each photoelectric transformation element 11. Charges accumulated in each photoelectric transformation element 11 may be transmitted to an FD 13 by each charge transfer device 15.

The non-shared pixel P may include the photoelectric transformation element 11. For the photoelectric transformation element 11, a photo-transistor, a photo-gate, a photo-diode (PD), a pinned PD (PPD), or the like may be used. For example, if the photoelectric transformation element 11 is a Complementary MOS (CMOS) image sensor (CIS), a PD or PPD may be used. Hereinafter, if a photoelectric transformation element may be implemented using a PD or PPD, it may be described as a PD. However, the PD and the PPD may be separately described when a photoelectric transformation element is exemplified as a PPD.

Accordingly, a PD 11 may absorb incident light, and generate and accumulate charges corresponding to the amount of light. The PD 11 may be coupled to the charge transfer device 15 for transferring the accumulated charges to the FD 13.

The FD 13 may receive the charges accumulated in the PD 11. Because the FD 13 may have a parasitic capacitance, the charges may be cumulatively stored. The FD 13 may be electrically connected to and configured to control the drive element 17.

The drive element 17, shown for example as a source follower amplifier, may amplify variations in the electric potential of the FD 13, which may receive charges accumulated in the PD 11. The drive element 17 may output the amplified variation to an output line Vout.

The reset element 18 may periodically reset the FD 13 to a reference value. The reset element 18 may be implemented with a single MOS transistor driven by a bias that may be provided through a reset line RX(i), for example. If the reset element 18 is turned on by the bias provided through the reset line RX(i), a given electric potential provided to the drain of the reset element 18, for example, supply voltage VDD, may be provided to the FD 13.

The select element 19 may be implemented with a single MOS transistor driven by a bias that may be provided through a row select line SEL(i). If the select element 19 is turned on by the bias provided through the row select line SEL(i), a given electric potential provided to the drain of the select element 19, for example, the supply voltage VDD, may be transferred to the drain region of the drive element 17.

A transmission line TX(i) for applying a bias to the charge transfer device 15, the reset line RX(i) for applying a bias to the reset element 18, and the row select line SEL(i) for applying a bias to the select element 19 may be arranged to extend along the direction of a row and to be substantially parallel to each other.

The layout of the APS array of the non-shared pixel image sensor according to an example embodiment is shown in FIG. 2A.

Referring to FIG. 2A, first and second unit pixel active areas A11 and A12, defined by device isolation regions, may be formed. Each unit pixel active area may form a unit active area of a non-shared pixel, which may include a photoelectric transformation active region PD and a read active region d.

Read gates formed in the read active region "d" of the first unit pixel active area A11 may partially overlap the photoelectric transformation region PD of the first unit pixel active area A11 or the second unit pixel active area A12. An insulating layer pattern C may be formed to electrically isolate the read gates RG, SF and SEL from the overlapping portion of the photoelectric transformation active region PD. The read gates of FIG. 2A may correspond to the drive element 17, the reset element 18 and/or the select element 19 of FIG. 1.

The photoelectric transformation active region PD may have a substantially rectangular shape, in which all or part of the four corners are chamfered to improve the efficiency of layout. Thus, the rectangle may be slightly deformed into a polygon having more than four sides. At least one side of a substantially rectangular shape may overlap the read gates SEL, SF, and RG. Further, the insulating layer pattern C may be formed to extend along the one overlapping side, but the formation of the insulating layer pattern C should not be limited to this example. Thus, the insulating layer pattern C may be formed along at least the one overlapping side, but may be formed in the overall region of the photoelectric transformation active region PD, except for the charge transfer gate TG. The insulating layer pattern C being formed along the one overlapping side is described herein as an example for explanatory purposes.

The insulating layer pattern C may be a single layer made of a nitride layer, an oxide layer, an oxynitride layer, a composite layer made of groups thereof, or the like. Further, the insulating layer pattern C may be formed to have a thickness that electrically isolates the read gates SEL, SF and RG from the photoelectric transformation active region PD.

Conventionally, the PD and the read gates (for example, a select element, a drive element, and a reset element) of an image sensor may need to be spaced apart from each other, thereby undesirably reducing the volume of the PD. If the photoelectric transformation active region PD is not spaced sufficiently apart from the read gates RG, SF and SEL, the photoelectric transformation active region PD may be adversely affected when voltage is applied to the read gates SEL, RG and SF. For example, the potential of the photoelectric transformation active region PD may increase, making it difficult for the charges in the photoelectric transformation active region PD to drift to the FD region due to this potential barrier. As a result, charge transfer efficiency may decrease. Further, if the potential of the interface of the photoelectric transformation active region PD increases, the amount of dark current may increase.

The volume of the photoelectric transformation active region PD per unit pixel may decrease, thus deteriorating signal saturation and sensitivity. Therefore, the photoelectric transformation active region PD and the read gates SEL, SF and RG may conventionally be required to be spaced sufficiently apart from each other.

According to an example embodiment, reducing the gate length of the read gates SEL, SF and RG to increase the volume of the photoelectric transformation active region PD may decrease signal intensity, thereby also decreasing the signal-to-noise (S/N) ratio. Accordingly, an image sensor according to an example embodiment may reduce or prevent loss of the volume of the PD from conventional spacing of the PD apart from the read gates SEL, SF and RG, by partially overlapping the photoelectric transformation active region PD with the read gates SEL, SF and RG. Further, the insulating layer pattern C for electrically isolating the photoelectric transformation active region PD and the read gates from each other may be formed, thus the potential of the photoelectric transformation active region PD may not increase even when voltage is applied to the read gates SEL, SF and RG. Therefore, an image sensor according to example embodiments may more effectively increase the volume of the photoelectric transformation active region PD and improve signal saturation and sensitivity.

The volume of the photoelectric transformation active region PD may be proportional to the number of electrons that may be accepted. Therefore, if the volume of the photoelectric transformation active region PD increases, the number of electrons that may be accepted may also increase, and signal saturation may likewise increase. Further, the volume of the photoelectric transformation active region PD may increase, and thus, a depletion area formed below the photoelectric transformation active region PD may also increase. The increase in the depletion layer may allow the number of electrons drifting into the photoelectric transformation active region PD to increase due to the influence of an electric field. Therefore, the number of electrons contributing to the potential of the photoelectric transformation active region PD may increase, and the sensitivity of the image sensor may be improved.

FIG. 2B is a sectional view of the image sensor taken along line B-B' of FIG. 2A. Referring to FIG. 2B, the image sensor may include an insulating layer pattern 120 interposed between each read gate 130 and a PD 140, in order to electrically isolate the read gate 130 from the PD 140. The insulating layer pattern 120 may be formed on a channel region 110 and partially overlap the top of the PD 140.

The PD 140 and the channel region 110 may be separately formed by device isolation regions 102 in a substrate 100. The PD 140 may accumulate photocharges generated by absorbing photons. For example, the PD 140, a PPD including an N-type PD 141 and a P-type PD 142 may be formed through two ion implantations. The N-type PD 141 may be formed relatively deep in the substrate 100, and the P-type PD 142 may be formed relatively shallow on the surface of the N-type PD 141. A P-type PD 142 formed relatively shallow on the surface of the N-type PD 141 may reduce or prevent dark current caused by damage to the surface of the N-type PD 141.

The channel region 110 may be formed with a first channel region and a second channel region, the first channel region being shallower than the second channel region. For example, the channel region 110 may be formed with a P-type channel region on top of an N-type channel region, the P-type channel region being shallower than the N-type channel region.

In the image sensor, a plurality of read gates 130 may be formed on the channel regions 110. Each read gate may partially overlap the top of the PD 140. Further, the insulating layer pattern 120 may be interposed between the overlapping portion of each read gate 130 and the PD 140 according to an example embodiment. Therefore, even if the read gate 130 and the PD 140 partially overlap each other, the read gate 130 may be electrically isolated from the PD 140.

The insulating layer pattern 120 for electrically isolating the PD 140 from the overlapping portion of the read gate 130 may be formed to prevent the potential of the PD 140 from increasing even if voltage is applied to the read gate 130. Therefore, the volume of the PD 140 may be more effectively increased, and signal saturation and sensitivity improved.

A charge transfer gate 135 may be formed adjacent to the read gate 130. The read gate 130 and the charge transfer gate 135 may each be made of a stacked layer of a gate oxide layer 132 and a gate conductive layer 134. The charge transfer gate 135 may transfer charges generated in the PD 140 to FD 160, for example, an N-type FD 160.

Hereinafter, a method of fabricating an image sensor according to an example embodiment will be described.

Figure 3:
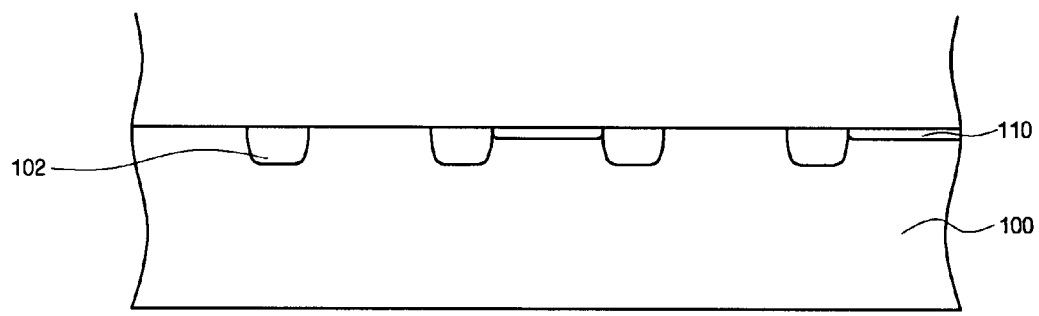
FIGS. 3 to 5 are diagrams showing a method of fabricating an image sensor according to an example embodiment.

As shown in FIG. 3, a region in which the PD 140 may be formed and a region in which a channel may be formed may be separately formed by device isolation regions 102 in the substrate 100. The device isolation regions 102 may be formed by a Shallow Trench Isolation (STD process, a LOCal Oxidation of Silicon (LOCOS) process, or the like, depending on the method of fabrication.

The channel region 110 may be doped with N-type impurity ions and formed by implanting the N-type impurity ions, for example, arsenic (As) ions. Ion implantation energy may be, for example, approximately 30 keV, and the dose thereof may be, for example, approximately $1\times10^{12}/cm^3$.

Figure 4:
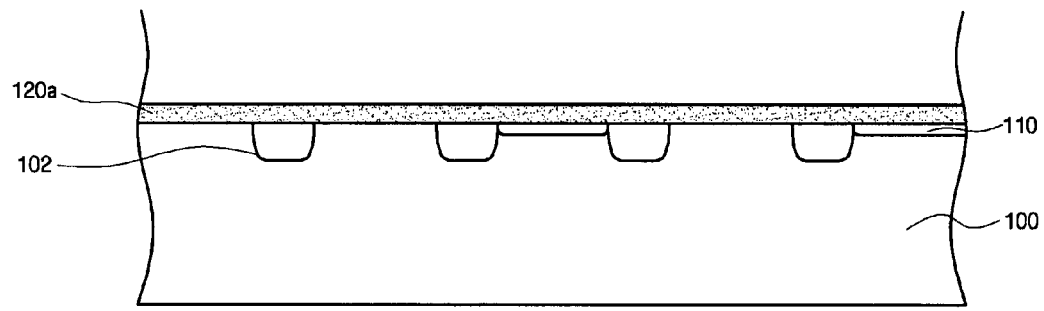

Referring to FIG. 4, an insulating layer 120a may be formed on the top of the surface of the substrate 100. The insulating layer 120a may be a single layer including a nitride layer, an oxide layer, an oxynitride layer, or a composite layer made of groups thereof The insulating layer 120a may be formed with a thickness to sufficiently electrically isolate a read gate and a PD from each other.

Figure 5:
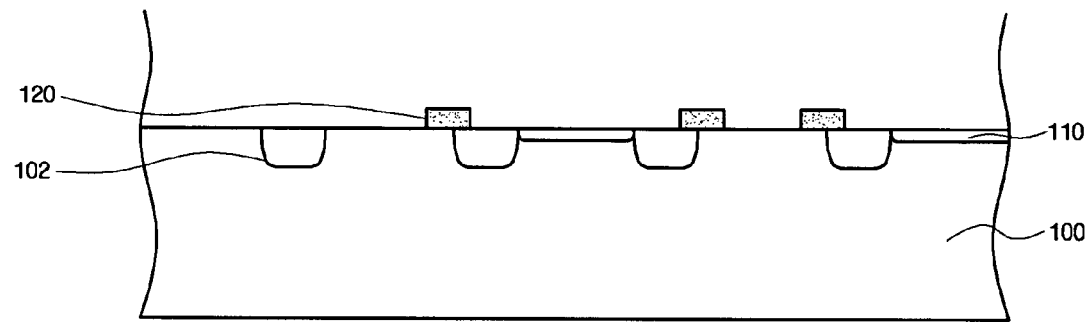

Referring to FIG. 5, the insulating layer 120a may be patterned using a mask pattern (not shown) as an etching mask to form the insulating layer pattern 120. For example, anisotropic dry etching may be used. The insulating layer pattern 120 may electrically isolate the read gate and the PD from each other.

Referring to FIG. 2B, the read gate 130 may be formed on the channel region and partially overlap the top of the region in which the PD 140 may be formed. The formation of the read gate 130 and the charge transfer gate 135 may be performed by forming a gate oxide layer and stacking a gate conductive layer, for example, a doped polysilicon layer, on top of the gate oxide layer. The gate conductive film and the gate oxide layer may be patterned to form the gate electrodes 130 and 135.

The charge transfer gate 135 adjacent to the read gate 130 may be formed on the substrate 100. The read gate according to an example embodiment, in contrast, may be patterned to partially overlap an adjacent insulating layer pattern 120. Thus, the read gate 130 may be formed to partially overlap the top of the region in which the PD may be formed. However, the read gate 130 may be electrically isolated from the PD 140 through the insulating layer pattern 120. Therefore, a read gate 130 overlapping the PD 140 but electrically isolated therefrom may be formed. Over-etching may be performed to obtain a relatively fine pattern of the read gate 130.

A region of the substrate 100, in which the PD 140 may be formed, may be selectively exposed, and ions may be implanted into the region to form the PD 140. N-type impurity ions, for example, may be implanted into the region of the PD 140. The first PD 141 doped with the N-type impurity ions may be formed in the substrate 100. Further, P-type impurity ions may be implanted into the region of the PD 140 to form the P-type PD 142 on the N-type PD 141. The P-type PD 142 may function to reduce or prevent dark current by reducing the number of electron-hole Pairs (EHP) that may be thermally generated on the surface of the semiconductor substrate 100.

The region of the substrate 100 in which the FD 160 may be formed may be selectively exposed, and N-type impurity ions, for example, may be implanted into the region to form the N-type FD 160.

Through the above process, an image sensor having improved signal saturation and sensitivity may be formed.

The insulating layer pattern 120 may be formed before the PD 140 is formed, however, the insulating layer pattern 120 may also be formed between the formation of the PD 140 and the formation of the read gate 130, depending on the fabrication methods employed.

Figure 6:
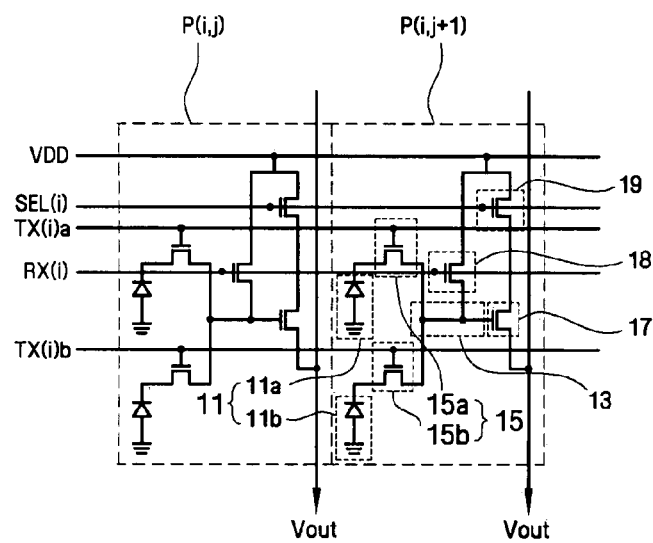
FIG. 6 is an example circuit diagram showing a two-shared pixel image sensor according to another example embodiment.

FIG. 6 is an example equivalent circuit diagram illustrating an APS array of a two-shared pixel image sensor according to an example embodiment.

Referring to FIG. 6, two-shared pixels P may be arranged in a matrix form, thus constituting an APS array. In each of the two-shared pixels P, two PDs adjacent to each other in the direction of a column may share read elements with each other.

Each two-shared pixel P may include two PDs 11a and 11b, adjacent to each other in the direction of a column. The two PDs 11a and 11b may share a drive element 17, a reset element 18, and a select element 19 with each other. Charges accumulated in each of the PDs 11a and 11b may be transferred to a common FD 13 through charge transfer devices 15a and 15b, respectively.

Figure 7:
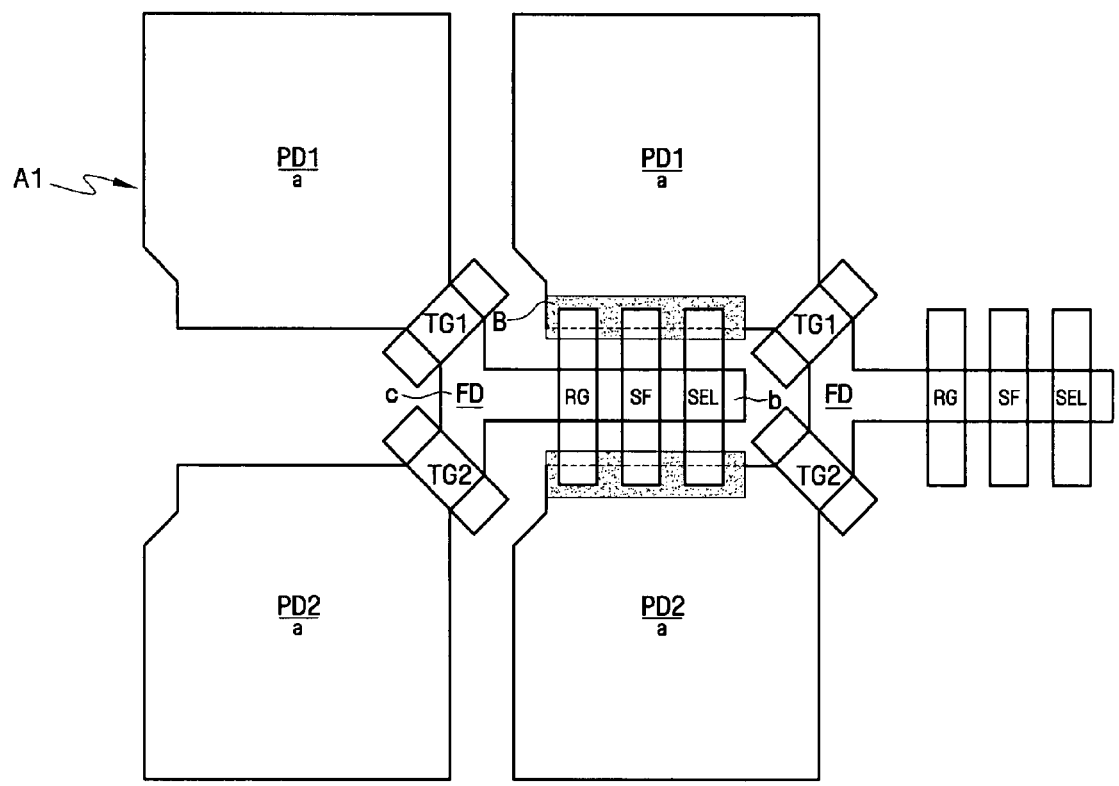
FIG. 7 is a diagram showing the layout of the two-shared pixel image sensor of FIG. 6.

The layout exemplified in FIG. 7 illustrates each two-shared pixel in which two PDs (PD1 and PD2) may share read gates. For example, a drive element SF, a reset element RG, and a select element SEL, may be shared between PD1 and PD2.

The two-shared pixel may be implemented using a first active area A1, which may be a one-axis merged dual lobe-type active area, for example. The reset element, the drive element and the select element may be formed on the axis read element active region "b" of the first pixel active area A1.

The read gates SF, SEL and RG of the axis read element active region "b" may partially overlap the PDs placed in a second pixel active area adjacent to the first pixel active area A1, but the read gates may be electrically isolated from the PDs by insulating layers B. Loss of area caused by conventional methods of spacing the PDs may be reduced or prevented in proportion to the overlapping portion, and the read gates may be electrically isolated from the PDs. Thus, an image sensor having improved sensitivity and signal saturation may be formed according to an example embodiment.

The first pixel active area A1 may be implemented so that a dual lobe active region "a" may be merged with a single axis read element active region "b" through a connection active region "c". The lobes of the dual lobe active region "a" may be opposite each other on the basis of the axis read element active region "b" in the direction of a column. Therefore, the one axis merged dual lobe-type active area may have an overall appearance substantially similar to, for example, the appearance of the hypocotyls of a young dicotyledon and a double cotyledon branching from the hypocotyls.

As described above, for the two-shared pixel as well as the non-shared pixel, adjacent PDs and read gates may partially overlap each other while being electrically isolated from each other by insulating layer patterns.

Figure 8:
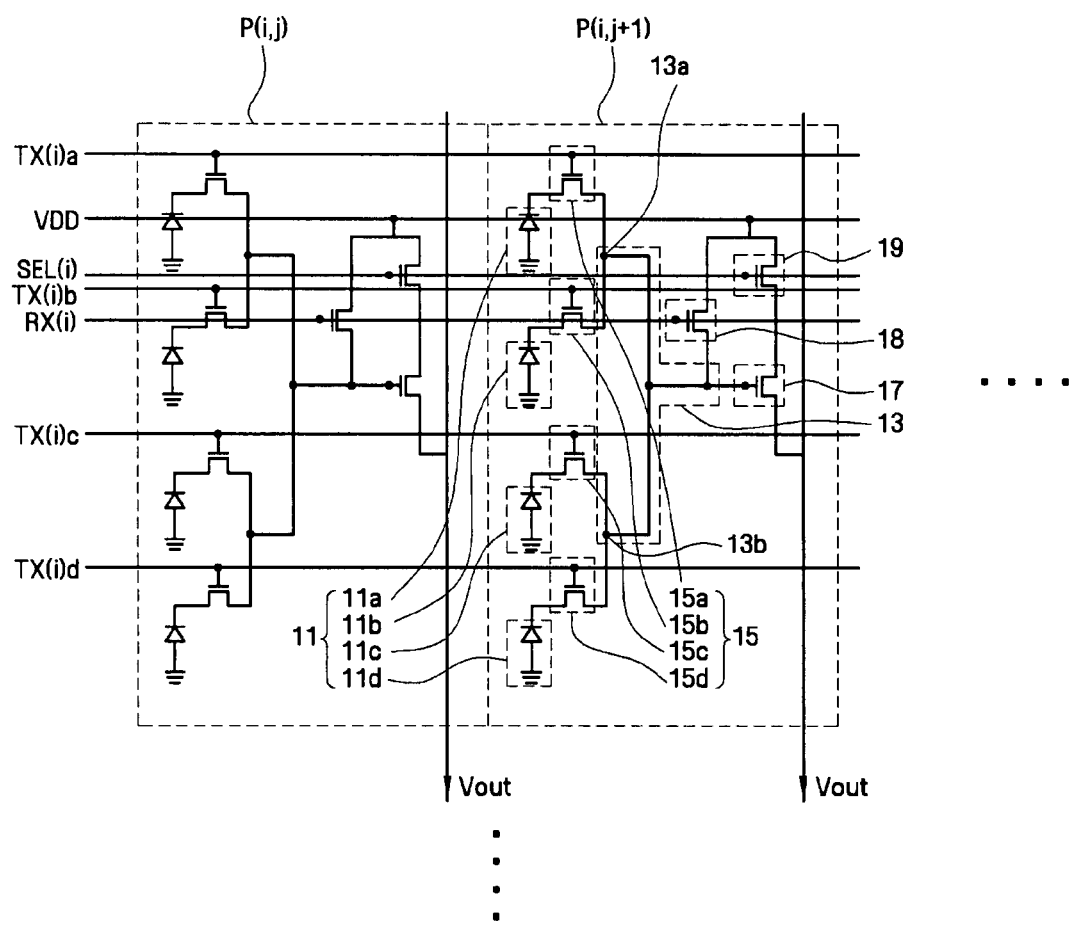
FIG. 8 is an example circuit diagram showing a four-shared pixel image sensor according to another example embodiment.

FIG. 8 is an example equivalent circuit diagram illustrating a four-shared pixel image sensor. Each four-shared pixel P may include four PDs 11a, 11b, 11c and 11d. In the four-shared pixel P, the four PDs 11a, 11b, 11c and 11d may share a drive element 17, a reset element 18 and/or a select element 19 with each other.

Each of the four PDs 11a, 11b, 11c and 11d may absorb incident light and accumulate charges corresponding to the amount of incident light. The four PDs 11a, 11b, 11c and 11d may be coupled to respective charge transfer devices 15a, 15b, 15c and 15d for transferring the accumulated charges to a Floating Diffusion Region (FD) 13. The FD 13 may include a first FD 13a, which may be shared between two PDs 11a and 11b, and a second FD 13b, which may be shared between the other two PDs 11c and 11d and be electrically connected to the first FD 13a. The parasitic capacitance of the first FD 13a may be connected in series with the parasitic capacitance of the second FD 13b, so that the overall parasitic capacitance of the FD 13 may be reduced or minimized. Thus, the transferred charges may be used as sufficient driving voltage for the drive element 17.

Figure 9:
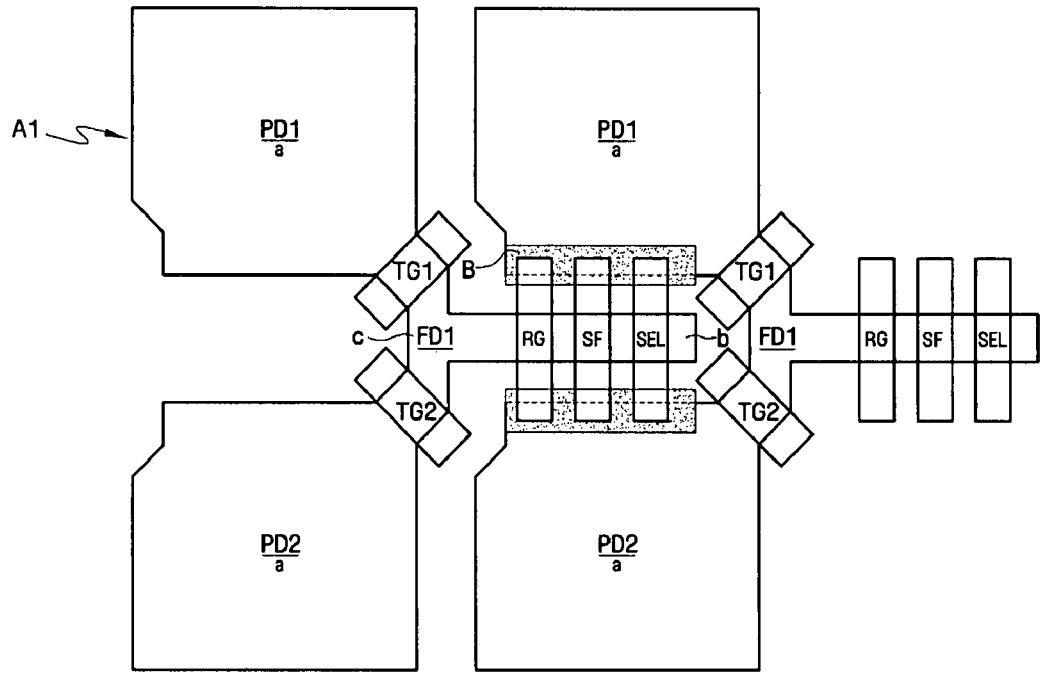
FIG. 9 is a diagram showing the layout of the four-shared pixel image sensor of FIG. 8.
Figure 9:
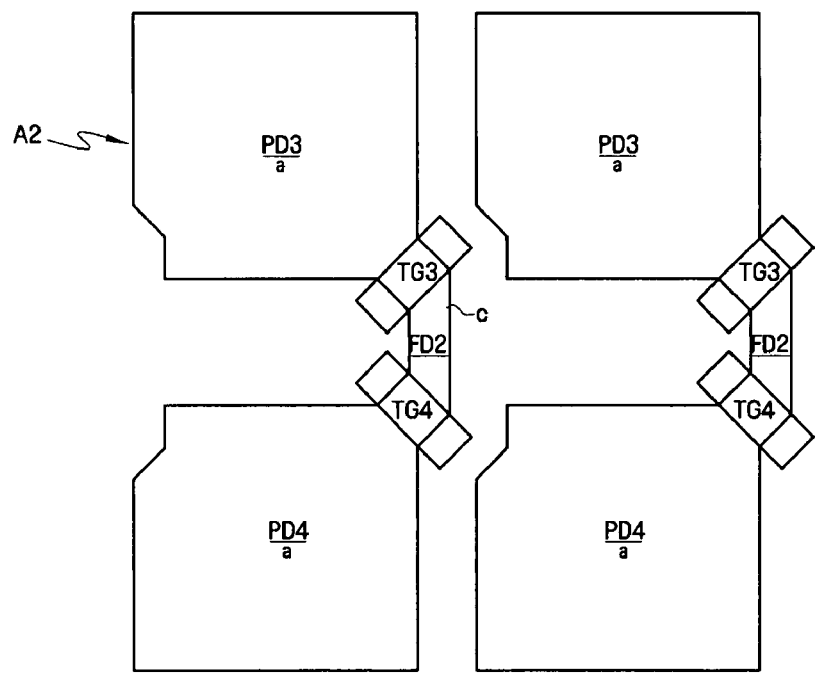

FIG. 9 is a diagram illustrating an example layout of FIG. 8.

Referring to FIG. 8, four PDs PD1, PD2, PD3 and PD4 may be separately formed in a first pixel active area A1, in which two PDs PD1 and PD2, sharing read gates SF, SEL and RG with each other, may be formed, and a no axis merged dual lobe-type second pixel active area A2, in which two PDs PD3 and PD4, sharing a second FD FD2 with each other, may be formed. In the second pixel active area A2, two lobes of the dual lobe active region "a" may be merged into a single active region through a connection active region "c" without requiring an axis.

The reset elements, the drive elements and the select elements may be formed on the axis read element active region "b" of the first pixel active area A1, which may be a one axis merged dual lobe-type active area.

Similar to FIGS. 2A and 7, the read gates SFG, RSG and RG may partially overlap the PDs PD1 and PD2 of an adjacent second pixel active area, but may be electrically isolated from the PDs through the insulating layer patterns C.

As described above, example embodiments may also include an image sensor having four-shared pixels. Further, example embodiments may provide an image sensor that may secure a relatively wide area of the PD and still maintain electrical isolation of the read gates from the PD, so that a fill factor may be enhanced, and signal saturation and sensitivity may be improved.

Figure 10:
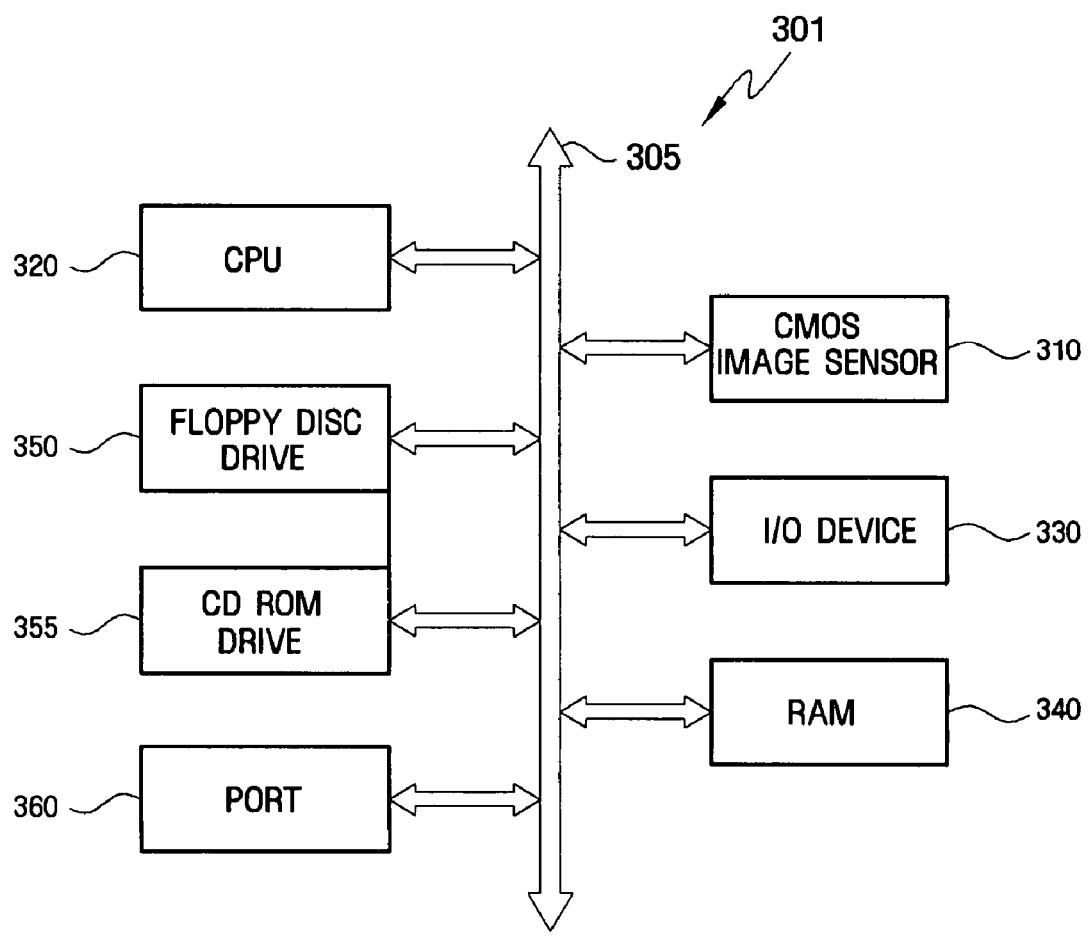
FIG. 10 is a schematic diagram showing a processor-based system including a CMOS image sensor according to example embodiments.

FIG. 10 is a schematic diagram illustrating a processor-based system including a CMOS Image Sensor (CIS) according to an example embodiment.

Referring to FIG. 10, a processor-based system 301 may process an image output from a CIS 310. The system 301 may be a computer system, a camera system, a scanner, a mechanized clock system, a navigation system, a video phone, a supervisor system, an automatic focus system, a tracking system, an operation monitoring system, an image stabilization system, etc. The processor-based system 301 is not limited to this example.

The processor-based system 301 may include a central processing unit (CPU) 320, for example, a microprocessor capable of communicating with an input/output (I/O) device 330 through a bus 305. The CIS 310 may communicate with the system 301 through the bus 305 or other communication links. The processor-based system 301 may further include Random Access Memory (RAM) 340, a floppy disc drive 350 and/or a Compact Disc (CD)-Read Only Memory (ROM) drive 355, and a port 360, which may communicate with the CPU 320 through the bus 305. The port 360 may be a port for coupling a video card, a sound card, a memory card, a Universal Serial Bus (USB) device, etc., to the system, or for transmitting/receiving data to/from other systems. The CIS 310 may be integrated with a CPU, a Digital Signal Processor (DSP), or a microprocessor, for example. Further, the CIS 310 may be integrated with a memory. The CIS may be integrated into a chip separate from a processor as well.

As described above, methods of fabricating an image sensor and image sensors fabricated according to example embodiments may have several advantageous features. Read gates may be formed on a photoelectric transformation element to overlap the photoelectric transformation element while being electrically isolated from the photoelectric transformation element. Thus, the area of the photoelectric transformation element may be secured. The area of the photoelectric transformation element may be increased, and thus the fill factor may be enhanced. Because the fill factor may be enhanced, an image sensor having improved sensitivity and signal saturation may be provided.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. An image sensor, comprising:
    a plurality of photoelectric transformation active regions formed on a substrate;
    a plurality of read active regions, each read active region formed adjacent to one of the plurality of photoelectric transformation active regions; and
    at least two read gates on each read active region and partially overlapping at least one of the adjacent photoelectric transformation active regions, wherein
    each read gate is electrically isolated from the overlapping portion of the photoelectric transformation active region.

2. The image sensor of claim 1, further comprising:
    a plurality of first and second unit pixel active areas defined by device isolation regions in the substrate, each unit pixel active area including one of the plurality of read active regions and one of the plurality of photoelectric transformation active regions.

3. The image sensor of claim 2, wherein the at least two read gates includes at least one of a reset element, a drive element and a select element.

4. The image sensor of claim 2, further comprising:
    a plurality of insulating layer patterns, each configured to electrically isolate the at least two read gates from one of the photoelectric transformation active regions.

5. The image sensor of claim 4, wherein:
    each photoelectric transformation active region has a substantially rectangular shape, at least one side of which overlaps the at least two read gates, and
    each insulating layer pattern is formed to extend along the one overlapping side.

6. The image sensor of claim 4, wherein each insulating layer pattern is made of a nitride layer, an oxide layer, an oxynitride layer, or a composite layer thereof.

7. The image sensor of claim 4, wherein each insulating layer pattern has a thickness sufficient to electrically isolate each read gate from each adjacent photoelectric transformation active region.

8. An image sensor, comprising:
    a photoelectric transformation element and a channel region separated by a device isolation region in a substrate;
    at least two read gates on the channel region and partially overlapping the photoelectric transformation element; and
    an insulating layer pattern configured to electrically isolate the at least two read gates from the photoelectric transformation element.

9. The image sensor of claim 8, wherein the at least two read gates includes at least one of a reset element, a drive element and a select element.

10. The image sensor of claim 8, wherein the insulating layer pattern is formed to cover at least a portion of the device isolation region and at least a portion of the photoelectric transformation element.

11. The image sensor of claim 10, wherein the insulating layer pattern is made of a nitride layer, an oxide layer, an oxynitride layer, or a composite layer thereof.

12. The image sensor of claim 10, wherein the insulating layer pattern has a thickness sufficient to electrically isolate the at least two read gates from the photoelectric transformation element.

13. A method of fabricating an image sensor, the method comprising:
    forming a plurality of photoelectric transformation active regions on a substrate;
    forming a plurality of read active regions on the substrate, each read active region formed adjacent to one of the plurality of photoelectric transformation active regions; and
    forming at least two read gates on each read active region to partially overlap at least one of the adjacent photoelectric transformation active regions, each read gate being electrically isolated from the overlapping portion of the photoelectric transformation active region.

14. The method of claim 13, further comprising:
    forming first and second unit pixel active areas by using device isolation regions to divide the plurality of photoelectric transformation active regions and the plurality of read active regions, each unit pixel active area including one of the plurality of photoelectric transformation active regions and one of the plurality of read active regions.

15. The method of claim 14, wherein the at least two read gates includes at least one of a reset element, a drive element and a select element.

16. The method of claim 14, further comprising:
    forming a plurality of insulating layer patterns to electrically isolate the plurality of photoelectric transformation active regions from the at least two read gates.

17. The method of claim 16, wherein each photoelectric transformation active region is formed in a substantially rectangular shape, at least one side of which overlaps the at least two read gates, and
    each insulating layer pattern is formed to extend along the at least one overlapping side.

18. The method of claim 16, wherein each insulating layer pattern is made of a nitride layer, an oxide layer, an oxynitride layer, or a composite layer thereof.

19. The method of claim 16, wherein each insulating layer pattern has a thickness sufficient to electrically isolate the at least two read gates from the photoelectric transformation element.

20. A method of fabricating an image sensor, the method comprising:
    forming a photoelectric transformation element on a substrate;
    forming a channel region on the substrate; forming a device isolation region to separate the photoelectric transformation region from the channel region
    forming at least two read gates on the channel region and partially overlapping the photoelectric transformation element and forming an insulating layer pattern, the insulating layer pattern configured to electrically isolate the at least two read gates from the photoelectric transformation element.

21. The method of claim 20, wherein the at least two read gates includes at least one of a reset element, a drive element and a select element.

22. The method of claim 20, further comprising:
    forming the insulating layer pattern to cover at least a portion of the device isolation region and at least a portion of the photoelectric transformation element.

23. The method of claim 22, wherein the insulating layer pattern is made of a nitride layer, an oxide layer, an oxynitride layer, or a composite layer thereof.

* * * * *